United States Patent [19]

Taskar et al.

[11] Patent Number: 5,786,233
[45] Date of Patent: Jul. 28, 1998

[54] PHOTO-ASSISTED ANNEALING PROCESS FOR ACTIVATION OF ACCEPTORS IN SEMICONDUCTOR COMPOUND LAYERS

[75] Inventors: Nikhil R. Taskar, Regopark; Donald R. Dorman, Carmel, both of N.Y.; Dennis Gallagher, Stamford, Conn.

[73] Assignee: U.S. Philips Corporation, New York, N.Y.

[21] Appl. No.: 603,959

[22] Filed: Feb. 20, 1996

[51] Int. Cl.$^6$ ............................................. H01L 21/00
[52] U.S. Cl. ................... 438/46; 438/45; 438/510; 438/518; 438/522
[58] Field of Search ................... 438/45, 46, 510, 438/520, 518, 522

[56] References Cited

U.S. PATENT DOCUMENTS

| | | | |
|---|---|---|---|
| 4,735,910 | 4/1988 | Mitsuyu et al. | 438/46 |
| 5,063,116 | 11/1991 | Mooney et al. | 438/522 |
| 5,264,397 | 11/1993 | Lin et al. | 437/129 |
| 5,273,933 | 12/1993 | Hatano et al. | 437/129 |
| 5,306,662 | 4/1994 | Nakamura et al. | 437/107 |
| 5,354,708 | 10/1994 | Taskar et al. | 437/106 |
| 5,426,068 | 6/1995 | Imaizumi et al. | 437/133 |
| 5,496,766 | 3/1996 | Amano et al. | 438/46 |
| 5,597,761 | 1/1997 | Adomi et al. | 438/46 |

FOREIGN PATENT DOCUMENTS 07097300A 4/1995 Japan.

OTHER PUBLICATIONS

Pearton et al. in "Electronics Letters, vol. 30(6),Mar. 1994", in Electrical passivationin hydrogen plasma exposed GaN, Mar. 1994.

Japan J. Applied Physics vol. 31 (1992), pp. 1258–1266 by S. Nakamura et al; vol. 30, 1991, pp. L–L; vol. 31, 1992, pp. L139–L142.

Applied Physics Letter, 65(5) 1994, pp. 593–594, by T. Tanka et al.

*Primary Examiner*—Tuan H. Nguyen
*Attorney, Agent, or Firm*—Norman N. Spain

[57] ABSTRACT

Active acceptor concentrations of p-doped II-VI and III-V semiconductor compound layer provided by chemical vapor deposition are increased by photo-assisted annealing.

20 Claims, No Drawings

PHOTO-ASSISTED ANNEALING PROCESS FOR ACTIVATION OF ACCEPTORS IN SEMICONDUCTOR COMPOUND LAYERS

BACKGROUND OF THE INVENTION

This invention relates to the manufacture of p-doped II-VI and III-V semiconductor compound layers. In particular this invention relates to a method of increasing the active acceptor concentration of p-doped II-VI and III-V semiconductor compound layers formed by chemical vapor deposition.

P-doped II-VI and III-V semiconductor compound layers are used in various semiconductor devices in particularly light-emitting devices such as, for example, blue light-emitting diodes, blue light-emitting laser diodes and UV-emitting diodes.

As shown in Nakamura et al. U.S. Pat. No. 5,306,662, the contents of which are hereby incorporated by reference, it is well known to produce such semiconductor compound layers by chemical vapor deposition and especially by a metalorganic chemical vapor deposition {MOCVTD} method.

Typically for producing a p-doped III-V compound the MOCVD method is carried out by introducing a gaseous metalorganic compound, ammonia or a gaseous amine and a gaseous compound of a p-dopant such as Mg, C or Zn into a reaction chamber heated to about 900° C.–1200° C. into which a suitable substrate is placed for producing a p-doped II-VI compound the same procedure is carried out except that a gaseous hydride such as hydrogen sulfide or hydrogen selenide, or instead of the hydride, a metalorganic nitride is added and the gaseous compound of the p-dopant such as Mg, C or Zn is omitted.

A shown in column 8 of the above-mentioned Nakamura et al., patent and S. Nakamura et al. Jpn. J. Appl. Phys. Vol.31 (1992) pp. 1258–1266 atomic hydrogen released from $NH_3$ during the MOCVD process binds with the Mg or Zn dopants so as to prevent them from acting as acceptors. As a result the active acceptor concentration of these layers is frequently less than desired and these layers exhibit undesirably high resistivities.

The patent further shows, in column 8, that the bonding of the hydrogen to the dopants may be broken by annealing the layers in a gas free of hydrogen atoms. This results in an increase in the concentration of the active acceptors.

Similar effects of annealing such MOCVD grown layers is also described in Nakamura et al. Jpn. J. Appl. Phys. Vol.31, (1992) pp L139-L142.

Low energy electron beam irradiation of such MOCVD grown p-doped layers has also been shown to result in an increase of the concentration of the active acceptors in Nakamura et al Jpn. J. Appl. Phys. Vol.30, (1991) pp. L-L.

The Nakamura et al. patent also shows in column 3, lines 40–55, breaking of the hydrogen-dopant bond by exposing the grown layers to electron beam radiation under conditions such that the surface temperatures of the layers are 600° C. or higher.

An increase in the concentration of active acceptors in such MOCVD grown p-doped layers has also been shown to be achieved by flash lamp annealing in T. Tanka et al. Appl. Phys. Lett, 65(5) (1994) pp. 593–594.

SUMMARY OF THE INVENTION

A principal object of this invention is to provide a method of increasing the active acceptor concentration of acceptors in a p-doped II-VI or III-V semiconductor compound layer formed by chemical vapor deposition, during which deposition bonding of hydrogen to the p-dopants(hydrogen passivation) occurs. It is a particular object of this invention to increase the concentration of active acceptors in such layers formed by metalorganic chemical vapor deposition (MOCVD).

According to the invention a new and improved method of increasing the active acceptor concentration of acceptors in a hydrogen passivated p-doped II-VI or III-V chemical vapor deposition formed layer comprises heating the layer to an annealing temperature below the decomposition temperature of the layer but high enough to result in a decrease in the resistivity and an increase in the net acceptor concentration of the layer while exposing the layer to photoexcitation with radiation of a wavelength shorter than the bandgap wavelength of the layer at the annealing temperature for a continuous period of at least about 2 minutes.

DETAILED DESCRIPTION OF THE INVENTION

The method of the invention is applicable to all p-doped II-VI or p-doped III-V layers provided by chemical vapor deposition in which hydrogen passivation of acceptors takes place during the deposition process. However it is particularly applicable to such layers that are formed by MOCVD particularly since the presence of the organic moieties present in the metalorganic compounds and hydrides employed as the sources of the components of the layers always provides atomic hydrogen as a result of the heating employed during the deposition, generally 500° C.–1200° C. Thus even if the dopant source is a hydrogen-free compound, some hydrogen passivation of acceptors always occurs.

Deposition by MOCVD may be carried out by methods well known in the art, for example the method described in the aforementioned U.S. Pat. No. 5,306,662, col. 1, lines 38–55, col. 8, lines 16–23, col. 12, line 54, col. 13, line 10, col. 15, lines 34–55 and col. 17, lines 34–62.

Examples of p-doped II-VI layers that may be employed are N-doped ZnSe, ZnS, ZnSSe, ZnCdSSe and ZnbgSSe in which formulae the atomic ratios may vary.

Preferably the III-V compounds are those of the formula $Ga_xIn_yAl_{1-x-y}N$ where $0 \leq x \leq 1$ and $x+y \leq 1$ and $x+y \leq 1$.

As p-dopants for the III-V compounds use made be made, for example of an element selected from the group consisting of Mg, Zn, Be, Cd, Ca, Ba and C.

The II-VI semiconductor compounds are p-doped with, for example, N.

While the semiconductor compound layer may be deposited on any suitable substrate, preferably the substrate is doped or undoped GaN, AlGaN, SiC, $Al_2O_3$, AlN, ZnO or spinel.

Annealing of the semiconductor compound layers is carried out in a hydrogen free atmosphere, preferably in an inert atmosphere such as a nitrogen atmosphere or a mixture of nitrogen and an inert gas. Generally the annealing temperature is about 500° C.–1000° C., but less than the decomposition temperature of the layer. preferred annealing temperature range is 650° C.–800° C.

The time during which photoexcitation is carried out preferably is about 5 minutes–60 minutes and varies inversely with the annealing temperature.

In general best results are achieved when the photoexcitation is carried out at an annealing temperature of 650° C.–800° C. for 5 minutes–60 minutes while being exposed to radiation of a wavelength shorter than the wavelength corresponding to the bandgap of the sample at the annealing temperature.

For GaN the bandgaps may be determined from the formula λ=12396/(3.39-T×6×10⁻⁴) where is the wavelength corresponding to the bandgap of GaN at the annealing temperature, where T is the annealing temperature in ° C. and A is in Å. At annealing temperatures of 600° C. and 800° C., the wavelengths corresponding to the bandgaps of GaN would be 4130Å and 4260Å respectively.

The method of the invention is particularly useful for increasing the active acceptor concentration in at least one hydrogen-passivated p-doped III-V semiconductor compound layer provided in a blue-green light or ultraviolet emitting semiconductor compound device such as is described in the above-noted Nakamura et al. U.S. Pat. No. 5,306,662.

DESCRIPTION OF THE PREFERRED EMBODIMENTS

EXAMPLE A

The following experiments were conducted on samples of a Mg doped GaN layer grown by MOCVD.

These samples were subjected to the annealing processes described below, all carried out in a nitrogen gas ambient.

1) Conventional thermal annealing carried out in a furnace at a temperature of 800° C. without photoillumination.

2) Photo-assisted annealing carried out at a temperature of 800° C. for 30 minutes while being illuminated by a Xenor lamp.

3) Photo-assisted annealing at a temperature at a temperature of 1050° C. for 1 minute while being illuminated in a manner identical to Example 2A.

4) Photo-assisted annealing carried out at a temperature of 1050° C. for 2 minutes while being illuminated for a period of 2 minutes in a manner identical to Example 2A.

Thirty percent of the incident power was due to the wavelength above that corresponding to the bandgap of GaN at room temperature.

After annealing, ohmic contacts were formed at the corners of each (3 mm×3 mm square)annealed sample by evaporating Ni/Au and alloying the contact. The resistivity and hole carrier concentration values for each sample were then determined by use of a Hall measurement with the Van Der Pauw geometry. [give literature reference or describe].

The resistivity and/or hole carrier concentration values measured for the above-described samples are listed below:

| Sample | Resistivity (Ohm.cm) | Hole carrier Concentration (Cm⁻³) |
| --- | --- | --- |
| 1) | ~3.0 | ~1.0 × 10¹⁷ |
| 2) | 1.2 | 4.0 × 10¹⁷ |
| 3) | 1.3 | 3.7 × 10¹⁷ |
| 4) | 1.6 | 2.8 × 10¹⁷ |

The samples annealed with photo-assisted annealing (samples 2,3 and 4) exhibited higher hole carrier concentration and higher resistivities than the sample annealed using a conventional thermal anneal, sample 1.

Comparison of samples 2 and 3 shows that the results achieved are comparable for photo-assisted annealings carried out at a lower temperature for a longer duration (sample 2) and photo-assisted annealings carried out at a higher temperature for a shorter duration, sample 3.

At higher temperatures the duration of annealing becomes critical. This is shown by a comparison of samples 3 and 4. Both samples were annealed at the same high temperature, 1050° C., but sample 4 which was annealed for 2 minutes as compared to the 1 minute annealing time for sample 4 exhibited a significantly higher resistivity and lower hole carrier concentration. Thus at the high temperature employed, 1050° C., an increase of the annealing time of as little as one minute results in a detrimental effect on the electrical properties.

Further the annealing time at such a higher temperature is also critical because of the possibility of material degradation when the annealing is carried out for long periods.

In comparison the low temperature photoassisted annealing at 800° C.) process is relatively less sensitive to the duration of the annealing. Thus, for this low temperature annealing, varying the duration time from 20 minutes to 30 minutes causes no change in the electrical characteristics of the layer.

In addition photoassisted annealing at low temperatures (650° C.–850° C.) is less temperature sensitive. Varying the annealing temperature from 750° C. to 800° C. results in no change in the electrical characteristics of the layer.

Therefore it is preferable that the photoassisted annealing be carried out at a low temperature, specifically 650° C.–800° C. since the annealing process is easier to control at this temperature range and the results achieved are less sensitive to process variation as compared to the high temperature photoassisted annealing process, 1050° C.

EXAMPLE B

Under identical illuminating conditions, photoassisted annealing was used to activate Mg acceptors in $Al_{0.13}Ga_{0.87}N$. The annealing temperature and the duration of annealing were varied between 750° C. and 800° C. and between 20 minutes and 30 minutes respectively. In all cases the net acceptor concentration of the annealed samples was essentially the same, $4-5 \times 10^{19} cm^3$ as determined by C-V measurements.

EXAMPLE C

A comparison between lamp annealing with and without the presence of illumination by the above bandgap wavelengths was performed. Lamp annealing experiments were performed with the temperature of the sample held at 800° C.

The Mg doped GaN sample was placed on a Si wafer (4 inch diameter) which is heated by the irradiation from the lamps. The lamps were located above the GaN sample and were able to illuminate the entire Si wafer and the GaN sample. It should be noted that the area of the Si wafer was considerably larger than that of the GaN sample (<1 cm×1 cm). the temperature of the Si wafer (and the GaN samples) was monitored by a thermocouple in contact with the Si, in close proximity to the GaN sample.

In the case of annealing without the presence of illumination by the above bandgap wavelengths, another piece of Si (of a larger area than the GaN sample) was held between the lamp and the GaN sample. Due to the bandgap of Si being smaller than that of GaN, Si is not transparent to wavelengths shorter than that corresponding to the bandgap of GaN. Thus, the GaN sample was not illuminated by wavelengths shorter than that corresponding to its bandgap. The thermocouple was in contact with the substrate Si wafer in close proximity to the GaN sample. The GaN sample temperature, as monitored by the thermocouple, was identical to that in case of annealing with the presence of the illumination by the above bandgap wavelengths.

It was observed that the evaporated Au contacts formed an ohmic contact to the sample annealed with the presence of illumination by above bandgap wavelengths. However, the Au contacts did not form an ohmic contact and were observed to be rectifying on the sample annealed without the presence of illumination by above bandgap wavelengths.

Net acceptor concentration values were determined for these samples, using C-V measurements performed on Ti/Au schottky barrier diodes. The sample annealed without the presence of illumination by the above bandgap wavelengths, exhibited net acceptor concentration value of $2-3 \times 10^{19}$ cm$^{-3}$. The net acceptor concentration value measured for the sample annealed with the presence of illumination by above bandgap wavelengths was $4-5 \times 10^{20}$ cm$^{-3}$. the higher value of the net acceptor concentration, by almost an order of magnitude, is believed to be responsible for the Au contacts being ohmic for the sample annealed with the presence of illumination by above bandgap wavelengths. For Resistivity and Hall measurement using the Vander Pauw geometry see for example: "A Method of Measuring Specific Resistivity and Hall Effect of Disc or Arbitrary Shape" L. J. Van der Pauw, Philips Res. Rep., 13, 1(February 1958).

We claim:

1. A method of increasing the active acceptor concentration $N_A$ of acceptors in a hydrogen passivated p-doped II-VI or III-V semiconductor compound layer formed by chemical vapor deposition, said method comprising heating said layer to an annealing temperature which annealing temperature is below the decomposition temperature thereof but at least at a temperature at which there is a decrease in the resistivity of said layer and there is an increase in the net acceptor concentration of said layer while exposing said layer to photoexcitation with radiation of a wavelength shorter than the bandgap wavelength of said semiconductor compound layer at said annealing temperature for at least about 2 minutes.

2. The method of claim 1 wherein the semiconductor layer is grown by MOCVD.

3. The method of claim 2 wherein the semiconductor compound is a p-doped II-VI semiconductor compound.

4. The method of claim 3 wherein the II-VI semiconductor compound is p-doped with N.

5. A method of increasing the active acceptor concentration $N_A$ of acceptors in a hydrogen passivated p-doped III-V semiconductor compound layer formed by chemical vapor deposition, said method comprising heating said layer to an annealing temperature which annealing temperature is below the decomposition temperature thereof but at least at a temperature at which there is a decrease in the resistivity of said layer and there is an increase in the net acceptor concentration of said layer while exposing said layer to photoexcitation with radiation of a wavelength shorter than the bandgap wavelength of said semiconductor compound layer at said annealing temperature for at least about 2 minutes.

6. The method of claim 5 wherein the III-V compound is of the formula GaxInyAl1xN wherein $0 \leq x \leq 1$, $0 \leq y \leq 1$ and $x+y \leq 1$.

7. The method of claim 6 wherein the III-V compound is p-doped with an element selected from the group consisting of Mg, Zn, Be, Cd, Ca, Ba, and C.

8. The method of claim 7 wherein the layer is deposited on a substrate selected from the group consisting of undoped or doped GaN and 1 AlGaN and SiC, Al$_2$O$_3$, AlN, Zn, and spinel.

9. The method of claim 7 wherein the heating to the annealing temperature is carried out in an atmosphere consisting essentially of nitrogen.

10. The method of claim 9 wherein the layer is exposed to said photoexcitation for about 2 minutes—60 minutes.

11. The method of claim 10 wherein the semiconductor compound is GaN and the element is Mg.

12. The method of claim 10 wherein the annealing temperature is about 650° C.–1000° C.

13. The method of claim 11 wherein the annealing temperature is about 650° C.–800° C.

14. The method of claim 13 wherein the semiconductor compound layer is exposed to radiation of a wavelength of 4130Å–4260Å.

15. A method of increasing the active acceptor concentration of acceptors in at least one hydrogen passivated p-doped III-V semiconductor compound layer provided in a blue-green light or ultraviolet emitting semiconductor device by metalorganic chemical vapor deposition, said method comprising, prior to providing said device with contact layers, heating said device to an annealing temperature of the at least one semiconductor compound layer, which temperature is below the decomposition temperature thereof but at least at a temperature at which there is a decrease in the resistivity and an increase in the net acceptor concentration of said at least one semiconductor compound layer while exposing said device to photoexcitation with radiation of a wavelength shorter than the bandgap wavelength of said at least one semiconductor compound layer for at least about two minutes.

16. The method of claim 15 wherein at least one of said semiconductor compound layers is doped with an element selected from the group consisting of Mg, Zn, Be, Cd, Ca, Ba, and C.

17. The method of claim 16 wherein the III-V compound is a compound of the formula $Ga_xIn_yAl_{1-x-y}N$ wherein $0 \leq x \leq 1$, $0 \leq y \leq 1$ and $x+y \leq 1$.

18. The method of claim 17 wherein the heating is carried out in an atmosphere consisting essentially of nitrogen.

19. The method of claim 18 wherein at least one of said semiconductor compound layers is a layer of GaN p-doped with Mg.

20. The method of claim 19 wherein said device is heated at a temperature of 650° C.–800° C. while being exposed to photoexcitation with radiation of a wavelength of less than 3600Å for about 2–60 minutes.

* * * * *